(12) United States Patent
Tsuzuki et al.

(10) Patent No.: US 6,329,824 B1
(45) Date of Patent: Dec. 11, 2001

(54) METHOD OF MEASURING RESONANT FREQUENCY OF A RESONATOR AND COUPLING DEGREE OF TWO RESONATORS

(75) Inventors: Genichi Tsuzuki, Nishikamo-gun; Masanobu Suzuki, Toki, both of (JP)

(73) Assignee: Advanced Mobile Telecommunications Technology Inc., Nisshin (JP)

( * ) Notice: Subject to any disclaimer, the term of this patent is extended or adjusted under 35 U.S.C. 154(b) by 0 days.

(21) Appl. No.: 09/349,450

(22) Filed: Jul. 8, 1999

(30) Foreign Application Priority Data

Feb. 24, 1999 (JP) .................................................. 11-046877

(51) Int. Cl.$^7$ .................................................. G01R 27/04
(52) U.S. Cl. ........................................... 324/633; 324/636
(58) Field of Search ..................................... 324/633, 636, 324/637

(56) References Cited

U.S. PATENT DOCUMENTS

| | | |
|---|---|---|
| 3,938,064 | 2/1976 | O'Bryan, Jr. et al. . |
| 3,963,982 * | 6/1976 | Roberts ................................. 324/619 |
| 4,142,164 | 2/1979 | Nishikawa et al. . |
| 4,623,835 * | 11/1986 | Mehdizadeh et al. ................ 324/636 |
| 4,629,977 * | 12/1986 | English ................................. 324/618 |
| 4,735,906 * | 4/1988 | Bastiaans ............................ 324/71.1 |
| 5,227,730 * | 7/1993 | King et al. ........................... 324/633 |
| 5,334,941 * | 8/1994 | King ..................................... 324/637 |

OTHER PUBLICATIONS

Gerhard Sollner et al, "High–Power YBCO Microwave Filters and Their Nonlinearities", 5$^{th}$ International Superconductive Electronics Conference (ISEC '95), Sep. 18–21, 1995, Nagoya, Japan, pp. 517–520.

* cited by examiner

Primary Examiner—Safet Metjahic
Assistant Examiner—Jermele Hollington
(74) Attorney, Agent, or Firm—Nixon & Vanderhye P.C.

(57) ABSTRACT

A filter is composed of plural resonators formed on one surface of a dielectric substrate and a ground plane formed on the other surface. A resonant frequency of each resonator is accurately measured individually and independently from other resonators. Other resonators not selected for measurement are all short-circuited or covered with a conductive member to shift their resonant frequency to a region that does not interfere with the resonant frequency of the resonator under measurement. Also, a coupling coefficient of an arbitrary pair of resonators is accurately measured under no interference from other resonators in the similar manner.

24 Claims, 7 Drawing Sheets

METHOD OF MEASURING RESONANT FREQUENCY OF A RESONATOR AND COUPLING DEGREE OF TWO RESONATORS

CROSS-REFERENCE TO RELATED APPLICATION

This application is based upon and claims benefit of priority of Japanese Patent Application No. Hei-11-046877 filed on Feb. 24, 1999, the content of which is incorporated herein by reference.

BACKGROUND OF THE INVENTION

1. Field of the Invention

The present invention relates to a method of measuring a resonant frequency of a resonator, and more particularly to a method of measuring a resonant frequency of an individual resonator, a plurality of which constitute a filter.

2. Description of Related Art

A filter characteristic such as resonant frequency has to be adjusted after its manufacturing process is completed, because the characteristic usually deviates from its target due to various deviation factors such as dielectric constant of a substrate, thickness of layers, accuracy of a mask, manufacturing process conditions and the like. Such characteristic adjustment, or tuning is especially necessary for narrow band and low ripple filters.

Before or during such adjustment, it is necessary to accurately measure the resonant frequency of each resonator constituting a filter. Conventionally, a resonant frequency of each resonator is measured using a pair of probes attached to a resonator to be measured. Also, a coupling degree between two resonators selected arbitrarily among others is measured by the probes to check whether the coupling degree is realized as originally designed. However, the resonant frequency of an individual resonator and the coupling degree of two resonators cannot be accurately measured because of electromagnetic interference between the resonator to be measured and other neighboring resonators.

SUMMARY OF THE INVENTION

The present invention has been made in view of the above-mentioned problem, and an object of the present invention is to provide an improved method, in which the resonant frequency of a resonator selected from among plural resonators is accurately and independently measured while eliminating interference from other resonators. Another object of the present invention is to provide a method of accurately measuring the coupling degree between two resonators without having electromagnetic interference from other resonators.

A distributed-constant-type filter is composed of a dielectric substrate, plural resonators formed on one surface of the substrate and a ground plane formed on the other surface of the substrate. The resonators may be patterned in a shape having two ends such as a ring having a small open gap, an elongate stripe, or the like. One resonator, the resonant frequency of which is to be measured, is arbitrarily selected from the plural resonators. The two ends of non-selected resonators are short-circuited with a conductive member which is easily removable to shift their resonant frequency to a frequency which does not interfere with the resonant frequency of the selected resonator. Then, the resonant frequency of the selected resonator is measured without electromagnetic interference from other resonators. Each resonator is selected one by one and its resonant frequency is accurately measured independently from other resonators. The resonators and the ground plane may be made of a superconductive material.

The resonant frequency of resonators constituting a lumped-constant-type filter is measured in the similar manner. In this case, non-selected resonators are covered with a conductive member to shift their resonant frequency. Non-selected resonators may be partially covered with the conductive member so that at least their capacitor and inductor portions are covered.

A coupling degree or coefficient of any one pair of resonators selected from the plural resonators can be measured under similar arrangement. Resonators other than a selected pair are short-circuited or covered with the conductive member to eliminate interference with the selected pair.

According to the present invention, the resonant frequency of one resonator is precisely measured, because interference from other resonators is eliminated by short-circuiting or covering other resonators with a conductive member. Also, the coupling degree of any pair of resonators is precisely measured in the same manner.

Other objects and features of the present invention will become more readily apparent from a better understanding of the preferred embodiments described below with reference to the following drawings.

DETAILED DESCRIPTION OF THE PREFERRED EMBODIMENTS

Figure 1:
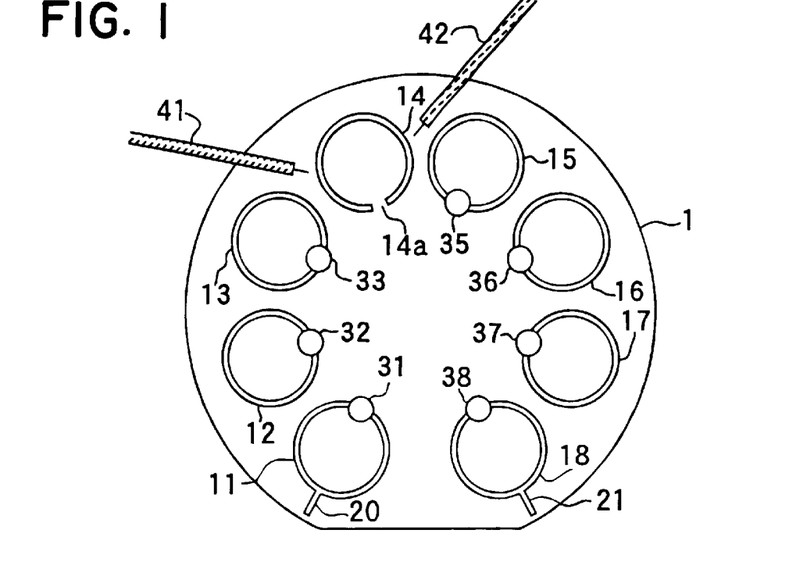
FIG. 1 is a plan view showing a method of measuring a resonant frequency of a selected resonator, other resonators being short-circuited by conductive members.
Figure 2:
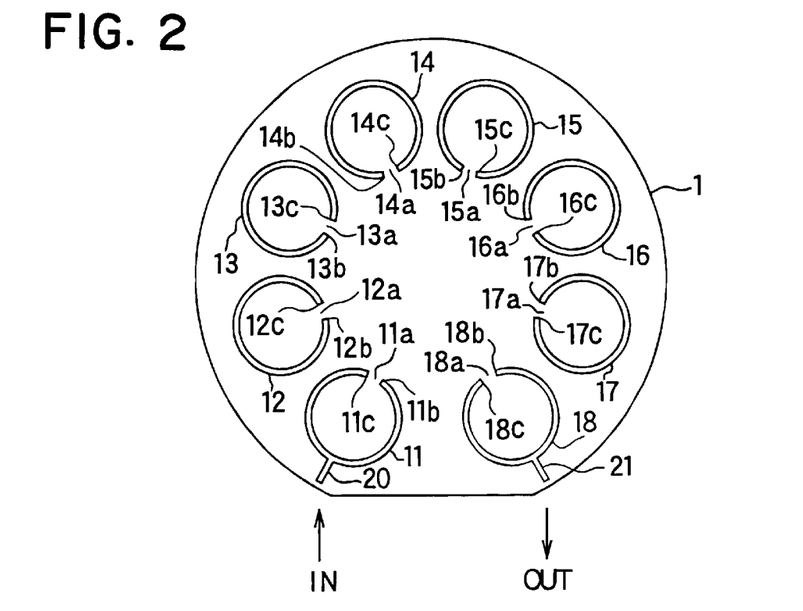
FIG. 2 is a plan view showing a filter having plural resonators formed on a substrate.

A preferred embodiment of the present invention will be described with reference to the drawings. FIG. 1 shows a method of measuring a resonant frequency of a selected resonator, while other resonators are short-circuited to eliminate electromagnetic interference. FIG. 2 shows a filter having plural resonators formed on a substrate.

First, referring to FIG. 2, a filter is composed of a dielectric substrate 1, plural resonators 11–18 formed on the dielectric substrate 1 and a ground plane (not shown) formed on the rear surface of the substrate 1. The filter is a distributed-constant-type filter and has a microstrip line structure. The plural resonators 11–18 are positioned along a circle having a certain radius from the center of the round substrate 1. A loop length of each resonator is designed to be one half of a wave length ($\lambda$), and one portion of the loop is open toward the center of the substrate 1. The open portion of each loop forms respective gaps 11a–18a between respective ends 11b, 11c–18b, 18c of the loop. Thus, each resonator 11–18 has two ends 11b, 11c–18b, 18c which is a portion of each of the resonators 11–18. A terminal 20 for an input signal is tapped from the resonator 11, and a terminal 21 for an output signal is tapped from the resonator 18. The resonators 11–18 and the ground plane are made of a superconductive material, and the substrate 1 is made of a dielectric material. In this particular embodiment, each resonator 11–18 is designed to have a 2 GHz resonant frequency. In other words, the target resonant frequency is 2 GHz.

Figure 3:
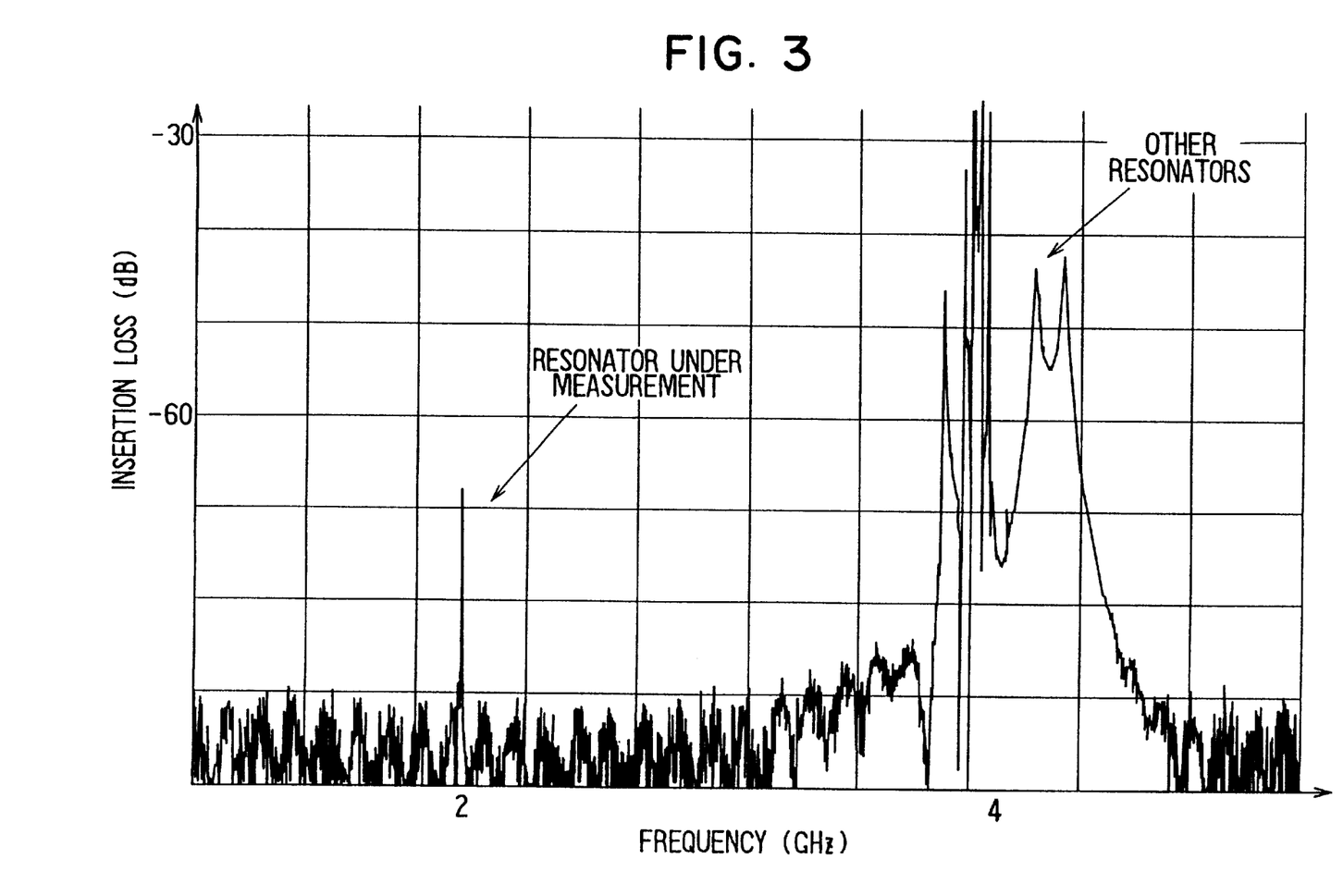
FIG. 3 is a graph showing frequencies at which a peak insertion loss appears in a resonator under measurement and other short-circuited resonators, respectively.

The resonant frequency of each resonator 11–18 is measured as shown in FIG. 1. FIG. 1 shows an exemplary situation where one resonator 14 is selected as a resonator to be measured. In order to avoid interference due to electromagnetic coupling between the selected resonator 14 and non-selected resonators, all the gaps of the non-selected resonators are short-circuited with conductive members 31–33, 35–38 which electrically connect the two ends 11b, 11c–13b, 13c and 15b, 15c–18b, 18c. The conductive material may be silver paste, a conductive tape or the like, which is easily removable. Thus, the resonant frequency of the resonator 14 can be precisely measured without interference from other resonators. An input probe 41 and an output probe 42 are placed as shown in FIG. 1, and the resonant frequency of the resonator 14 is measured. When the non-selected resonators are short-circuited, their resonant frequencies shift to a high side, becoming about double, that is, from about 2 GHz to about 4 GHz. This resonant frequency shift is shown in FIG. 3. The resonant frequency (the frequency at which insertion loss shows a peak) of the resonator 14 that is selected to be measured is about 2 GHz, while the resonant frequency of non-selected resonators that are short-circuited is around 4 GHz. In this manner, the resonant frequency of the selected resonator 14 is precisely measured. Non-selected resonators 11–13, 15–18 are measured in the same manner as the resonator 14 by selecting one by one and short-circuiting other resonators.

The resonant frequency of each resonator thus measured is compared with the target resonant frequency (e.g., 2 GHz), and each resonant frequency is adjusted or tuned to the target frequency. To adjust the resonant frequency, a pattern of the resonator may be trimmed with a laser beam, or trimmed by a photolithography process. If the resonator is made of a fragile material such as a superconductive material, it is preferable to use the photolithography technology to avoid any damage to the resonator in the trimming process. The resonant frequency may be adjusted by accumulating a proper amount of a dielectric material on the resonator pattern using the photolithography technology that is widely used in semiconductor manufacturing processes.

Figure 4:
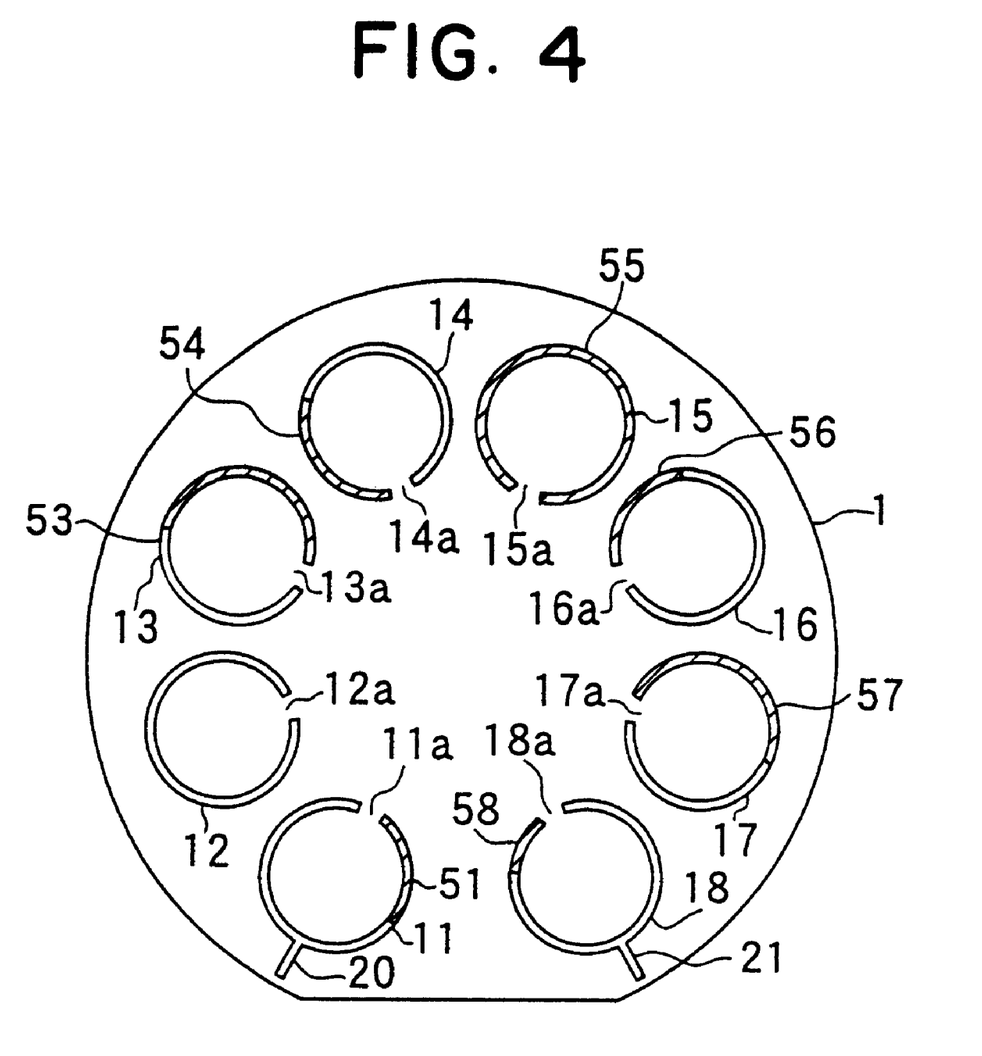
FIG. 4 is a plan view showing a filter having plural resonators, the resonant frequency of each resonator being adjusted with a dielectric layer formed thereon.
Figure 5A:
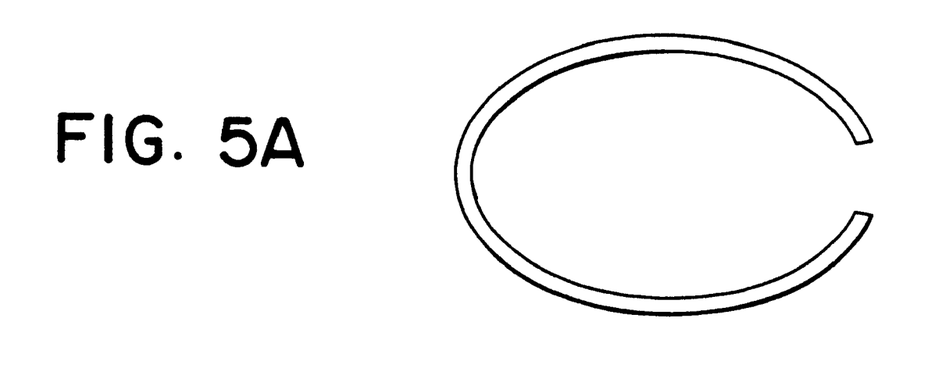
FIGS. 5A–5C are plan views showing various patterns of the resonator.
Figure 5B:
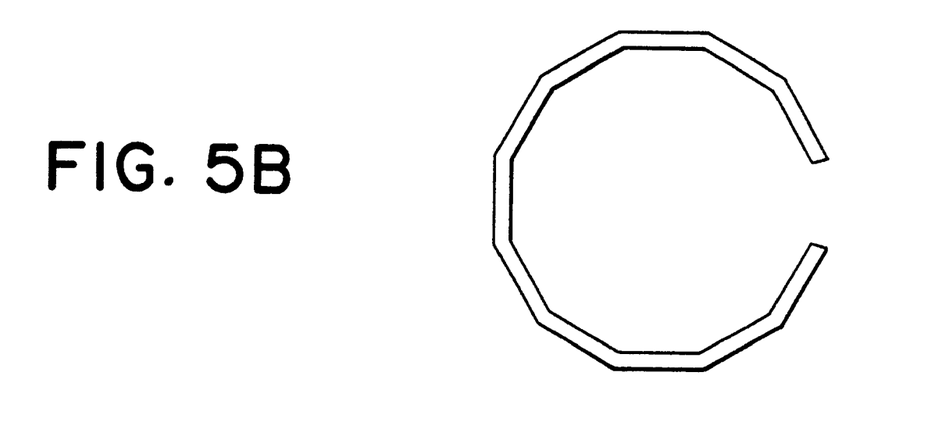
Figure 5C:
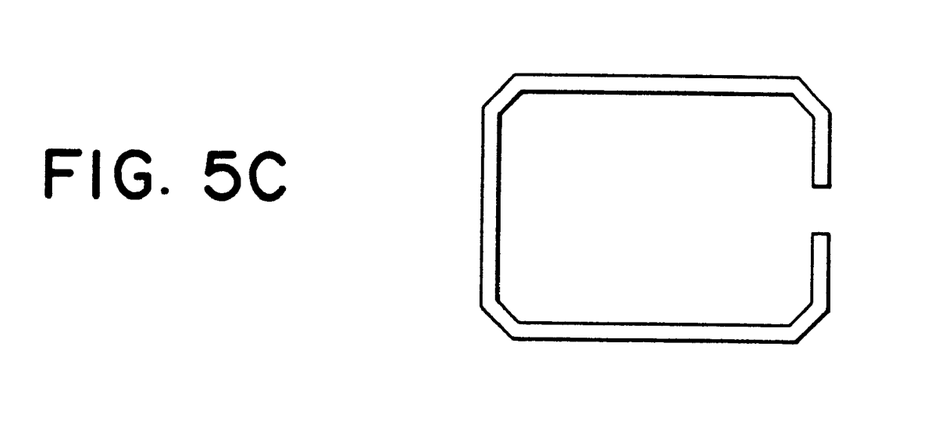

FIG. 4 shows a filter having plural resonators, each of which is adjusted by accumulating the dielectric material thereon. In this particular example, the resonator 12 originally has the target resonant frequency, and therefore no adjustment is required. Other resonators 11, 13–18 are adjusted by forming dielectric layers 51, 53–58 thereon, the amount of which is properly controlled according to a degree of deviation of each resonator from the target frequency. The amount of the dielectric material may be controlled by forming a layer having a uniform thickness on each resonator and altering an area covered with the dielectric material according to the degree of the deviation to be adjusted. The mask to be used in the photolithography process may be the one to individually cover each resonator, or the one to cover all the resonators at the same time. The dielectric material may be CeO, MgO, $SiO_2$ or the like. The shape of the resonator is not limited to the ring shape shown in FIG. 4, but it may be variously modified. FIGS. 5A–5C show some of the variations of the resonator shape.

Figure 6A:
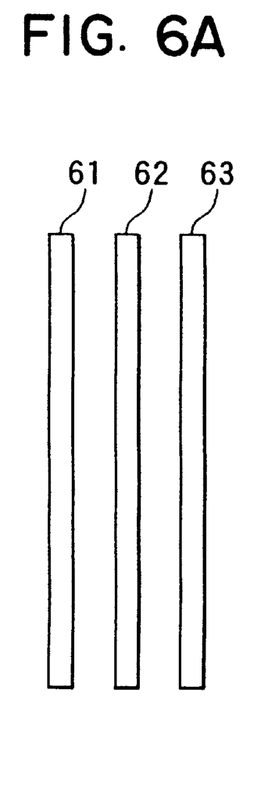
FIGS. 6A–6D are plan views showing a method of short-circuiting resonators other than a resonator to be measured, each resonator being formed into an elongate stripe.
Figure 6B:
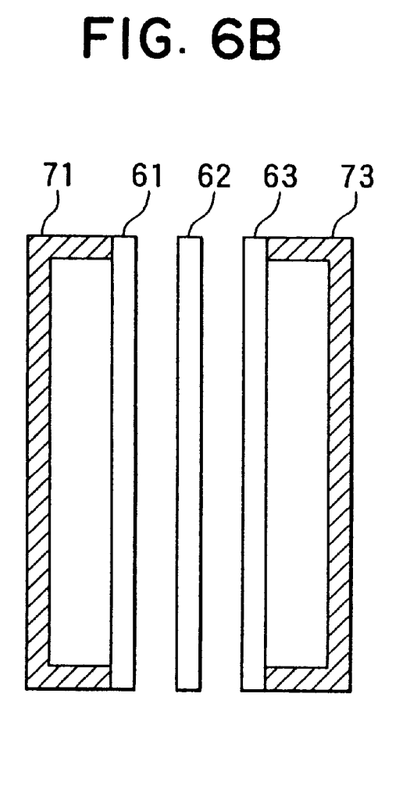
Figure 6C:
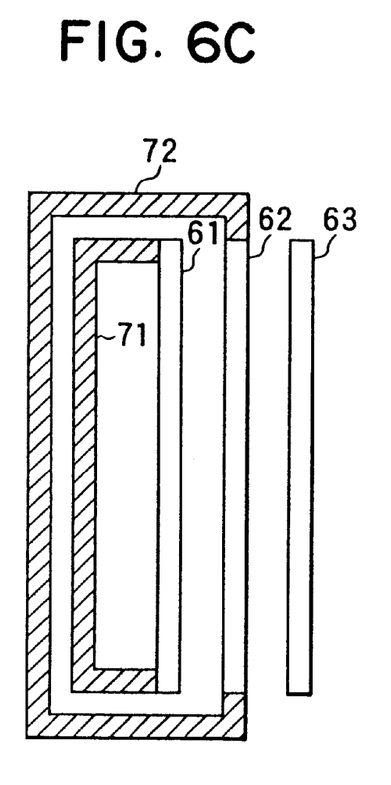

FIG. 6A shows another form of the resonators constituting a distributed-constant-type filter. Each resonator 61, 62, 63 is patterned into an elongate stripe. For measuring the resonant frequency of one selected resonator, other resonators are short-circuited with conductive members to avoid electromagnetic interference. FIG. 6B shows a situation where a resonator 62 is selected for measurement and other resonators 61, 63 are short-circuited with conductive members 71, 73, respectively. FIG. 6C shows a situation where a resonator 63 is selected for measurement and other resonators 61, 62 are short-circuited with conductive members 71, 72, respectively. The conductive members 71, 72, 73 are conductive tapes or the like which are easily removable. Each resonator is selected one by one while short-circuiting other resonators, and its resonant frequency is measured by placing probes at both ends. Since the resonant frequency of the short-circuited resonator considerably shifts from its original resonant frequency, electromagnetic interference with the selected resonator is eliminated. Thus, the resonant frequency of each resonator can be precisely measured independently from one another.

Figure 6D:
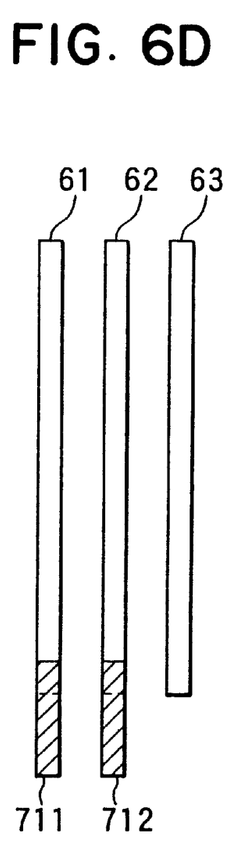

To shift the resonant frequency of non-selected resonators, they need not be necessarily short-circuited, but the conductive members 711, 712 may be placed at one end thereof, as shown in FIG. 6D. The length of conductive members 711, 712 is determined so that the resonant frequency sufficiently shifts to avoid interference with the resonator selected for measurement.

Figure 7:
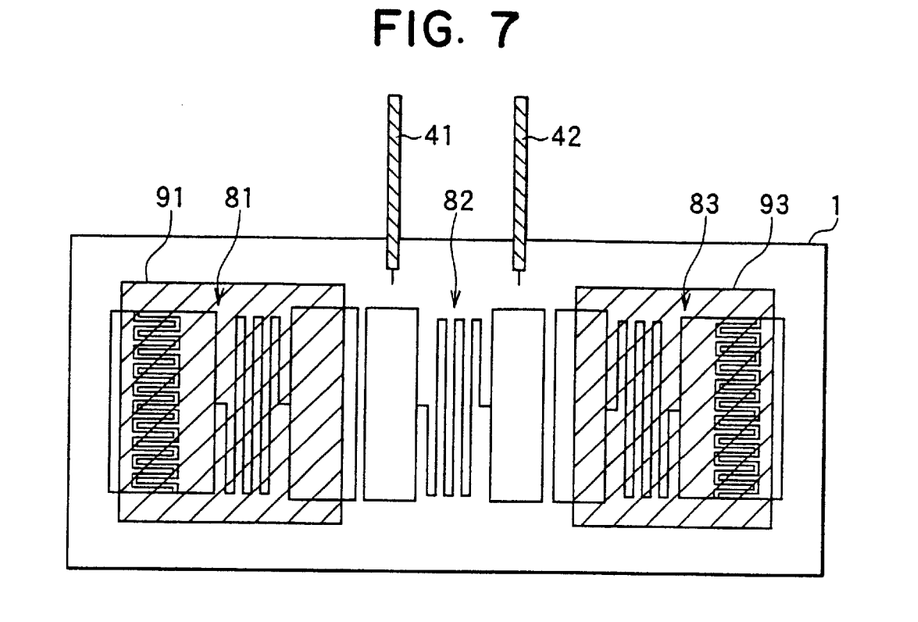
FIG. 7 is a plan view showing a lumped-constant-type filter, one resonator being measured by probes while other resonators being covered with conductive layers.

FIG. 7 shows a method of measuring the resonant frequency of each resonator in a lumped-constant-type filter. In this arrangement, too, the resonant frequency of each resonator can be independently measured in the similar manner as above. As shown in FIG. 7, the lumped-constant-type filter is composed of a substrate 1, plural resonators 81, 82, 83 formed on one surface of the substrate, and a ground plane (not shown) formed on the other surface of the substrate. To measure the resonant frequency of the resonator 82, for example, while avoiding interference from other resonators 81, 83, the resonators 81, 83 are covered with conductive members 91, 93, respectively. A easily removable material such as a conductive tape is used as the conductive member. When the resonators are covered with the conductive member, their resonant frequencies shift to a higher side, and electromagnetic interference with the resonator that is selected for measurement is avoided. Thus, the resonant frequency of each resonator is measured one by one independently from other resonators.

To shift the resonant frequency of non-selected resonators 81, 83, it is also possible to cover only capacitor and inductor portions of the resonators 81, 83. The frequency shift may be attained by any other ways, as long as the frequency shift is sufficiently high to avoid electromagnetic interference.

Figure 8:
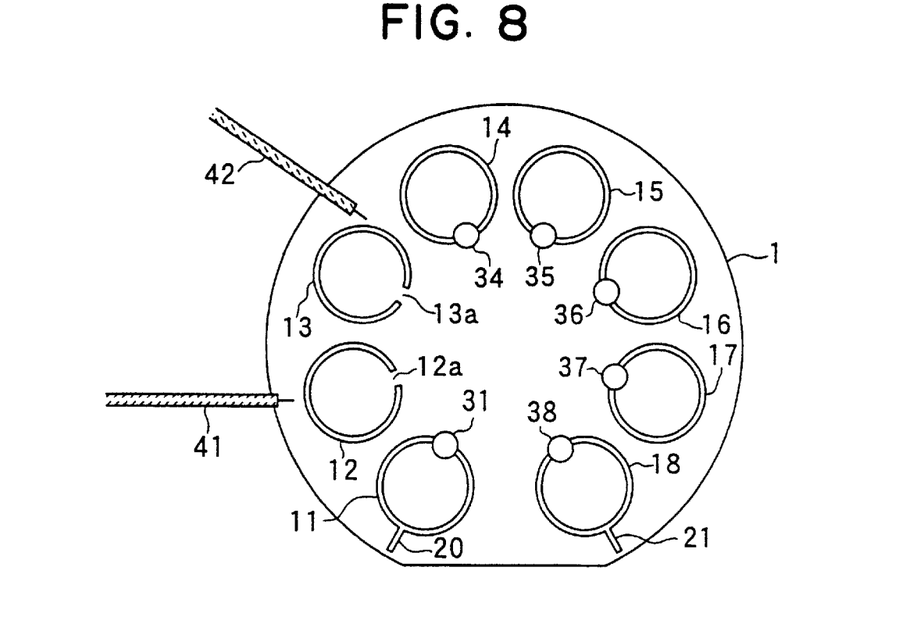
FIG. 8 is a plan view showing a method of measuring a coupling degree of two resonators, while other resonators are short-circuited with conductive members.

A coupling degree of two resonators can be measured in the similar manner as described above. One example of measuring the coupling degree is shown in FIG. 8. In FIG. 8, the coupling degree of the resonators 12 and 13 is measured by the input probe 41 and the output probe 42. Electromagnetic interference with other resonators 11, 14–18 is avoided by short-circuiting other resonators with the conductive members 31, 34–38, because the resonant frequencies of the short-circuited resonators shift to a higher side. The coupling degree of any pair of resonators can be similarly measured. Thus, whether an originally designed coupling degree is realized or not in the finished product is checked.

Figure 9:
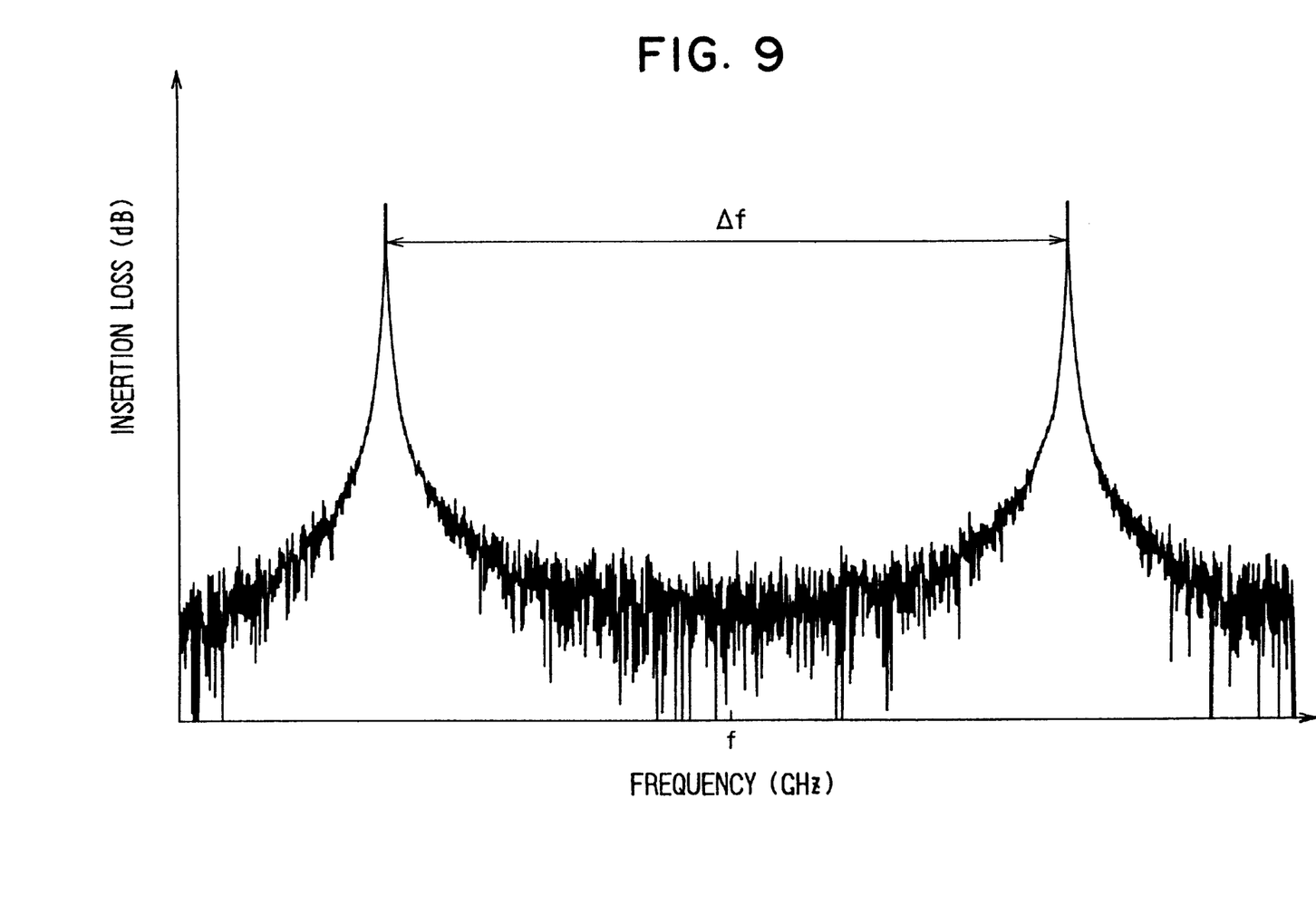
FIG. 9 is a graph showing frequency characteristics of two resonators under measurement, other resonators being covered with conductive layers.

FIG. 9 shows frequency characteristics of a pair of resonators (for example, 12 and 13), the coupling degree of which is measured, while other resonators (for example, 11, 14–18) are short-circuited. The graph in FIG. 9 shows the insertion loss (dB) on the ordinate versus frequency (GHz) on the abscissa. There appear two peaks, and a center frequency of both peaks is denoted as "f". The frequency difference between the two peaks is denoted as "Δf". The coupling coefficient of both resonators (e.g., 12 and 13) is expressed as f/Δf. In the same manner, the coupling coefficient of any pair of the resonators can be measured. As to other resonators having different patterns, or resonators constituting a lumped-constant-type filter such as the one shown in FIG. 7, the coupling degree or coefficient can be measured in the same manner as described above.

Application of the present invention is not limited to the filter having resonators made of a superconductive material but to other filters having resonators made of a usual conductive material. Also, the present invention is applicable to resonators constituting an oscillator.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method of measuring respective resonant frequencies of a plurality of resonators formed on a substrate, the method comprising steps of:
   selecting a resonator from among the plurality of resonators;
   attaching respective members onto non-selected resonators for shifting respective resonant frequencies of said non-selected resonators; and
   measuring a resonant frequency of the selected resonator of said plurality of resonators, said members not being attached to said selected resonator.

2. The method as in claim 1, wherein:
   each of the plurality of resonators has a superconductive strip having two open ends defining a gap therebetween on the substrate; and
   the member is removably attached across the gap thereby to connect the two open ends of each resonator to thus form a loop.

3. The method as in claim 1, wherein:
   each of the plurality of resonators has a superconductive strip pattern; and
   the member is shaped as a flat pad and removably attached to cover the superconductive strip pattern of each non-selected resonator.

4. The method as claim 1, wherein:
   the members are electrically conductive; and
   the members are removably attached to all the non-selected resonators to increase the resonant frequency of each of the non-selected resonators to a value which is about twice as high as the resonant frequency which the non-selected resonators had before the member is attached thereto.

5. The method as in claim 1, further comprising a step of:
   adjusting the resonant frequency of the selected resonator to a desired resonant frequency while measuring the resonant frequency of the selected resonator.

6. The method as in claim 5, further comprising a step of:
   detaching the members from the non-selected resonators after the adjusting step is completed.

7. The method as in claim 6, further comprising a step of:
   repeating the attaching step, the measuring step, the adjusting step and the detaching step by changing the selected resonator to another of the plurality of resonators.

8. The method as in claim 1, wherein each of said conductive members is a pad that short circuits two open ends of a respective one of said non-selected resonators.

9. A method of measuring respective resonant frequencies of a plurality of resonators constituting a distributed-constant-type filter, each resonator being formed on a substrate and having two ends, the method comprising steps of:
   selecting one resonator, the resonant frequency of which is to be measured, from among the plurality of resonators;
   short-circuiting with respective conductive members the two ends of the non-selected resonators of said plurality of resonators; and
   measuring the resonant frequency of the selected resonator.

10. The method as in claim 9, wherein:
    the two ends of the resonator form a small gap therebetween.

11. The method as in claim 9, wherein:
    the conductive members are easily removable from the non-selected resonators.

12. The method as in claim 9, wherein:
    the plurality of resonators are made of a superconductive material.

13. The method as in claim 9, further comprising steps of:
    adjusting the resonant frequency of the selected resonator until the measured resonant frequency reaches a desired resonant frequency; and
    removing the conductive members from the non-selected resonators after the adjusting step for the selected resonator.

14. The method as in claim 9, wherein the conductive members are not attached to the selected resonator.

15. The method as in claim 9, wherein each of said conductive members is a pad that short circuits two open ends of a respective one of said non-selected resonators.

16. A method of measuring respective resonant frequencies of a plurality of resonators constituting a lumped-constant-type filter, each resonator being formed on a substrate, the method comprising steps of:
    selecting one resonator, the resonant frequency of which is to be measured, from among the plurality of resonators;
    attaching respective conductive members onto non-selected resonators of said plurality of resonators for shifting respective resonant frequencies of said non-selected resonators; and
    measuring the resonant frequency of the selected resonator when electromagnetic interference from said non-selected resonaters is substantially eliminated.

17. The method as in claim 16, wherein:

the conductive member is easily removable from the resonators.

18. The method as in claim 16, further comprising steps of:

adjusting the resonant frequency of the selected resonator until the measured resonant frequency reaches a desired resonant frequency; and removing the conductive members from the non-selected resonators after the adjusting step for the selected resonator.

19. The method as in claim 16, wherein the conductive members are not attached to the selected resonator.

20. The method as in claim 16, wherein each of said conductive members is a pad that short circuits two open ends of a respective one of said non-selected resonators.

21. A method of measuring a coupling degree between two resonators among a plurality of resonators formed on a substrate, the method comprising steps of:

selecting two resonators, the coupling degree between which is to be measured;

attaching respective members for shifting respective resonant frequencies of said non-selected resonators; and measuring the coupling degree between the selected resonators.

22. The method as in claim 21, wherein the conductive members are not attached to the selected resonators.

23. The method as in claim 21, wherein each of said conductive members is a pad that short circuits two open ends of a respective one of said non-selected resonators.

24. The method as in claim 21, the non-selected resonators are all formed on the substrate.

\* \* \* \* \*